United States Patent [19]

Reeves

[11] Patent Number: 5,034,681
[45] Date of Patent: Jul. 23, 1991

[54] VOLTAGE DETECTION

[75] Inventor: Malcolm R. Reeves, Chippenham, Great Britain

[73] Assignee: Westinghouse Brake and Signal Holdings Limited, Great Britain

[21] Appl. No.: 447,099

[22] Filed: Dec. 6, 1989

[30] Foreign Application Priority Data

Feb. 13, 1989 [GB] United Kingdom ............... 8903176

[51] Int. Cl.⁵ ............................................. G01R 19/00
[52] U.S. Cl. .................................... 324/118; 307/350; 324/120
[58] Field of Search ................... 324/118, 120, 183 R, 324/183 P; 331/113 R; 363/22, 23; 307/261, 350

[56] References Cited

U.S. PATENT DOCUMENTS

| | | | |
|---|---|---|---|
| 3,679,975 | 7/1922 | Fein | 324/118 |
| 3,896,366 | 7/1975 | Onogi | 324/118 |
| 3,996,506 | 12/1976 | Kichak | 363/22 |
| 4,374,346 | 2/1983 | Tsuchiya et al. | 307/350 |
| 4,669,037 | 5/1987 | Bobry | 324/118 |

FOREIGN PATENT DOCUMENTS

| | | | |
|---|---|---|---|
| 1386928 | 4/1988 | U.S.S.R. | 324/118 |
| 1471731 | 4/1977 | United Kingdom . | |

Primary Examiner—Kenneth A. Wieder
Assistant Examiner—William J. Burns
Attorney, Agent, or Firm—Welsh & Katz, Ltd.

[57] ABSTRACT

A circuit arrangement for detecting an input voltage comprises an oscillator responsive to the voltage, the oscillator including a pair of transistors (8, 9) connected as an astable multivibrator, each of the transistors having a load which comprises a primary winding (16 or 17) of a current transformer (T) and a low resistance proof resistor (12 or 13). A current flows through a secondary winding (18) of the transformer the amplitude of which current is proportional to the input voltage.

5 Claims, 1 Drawing Sheet

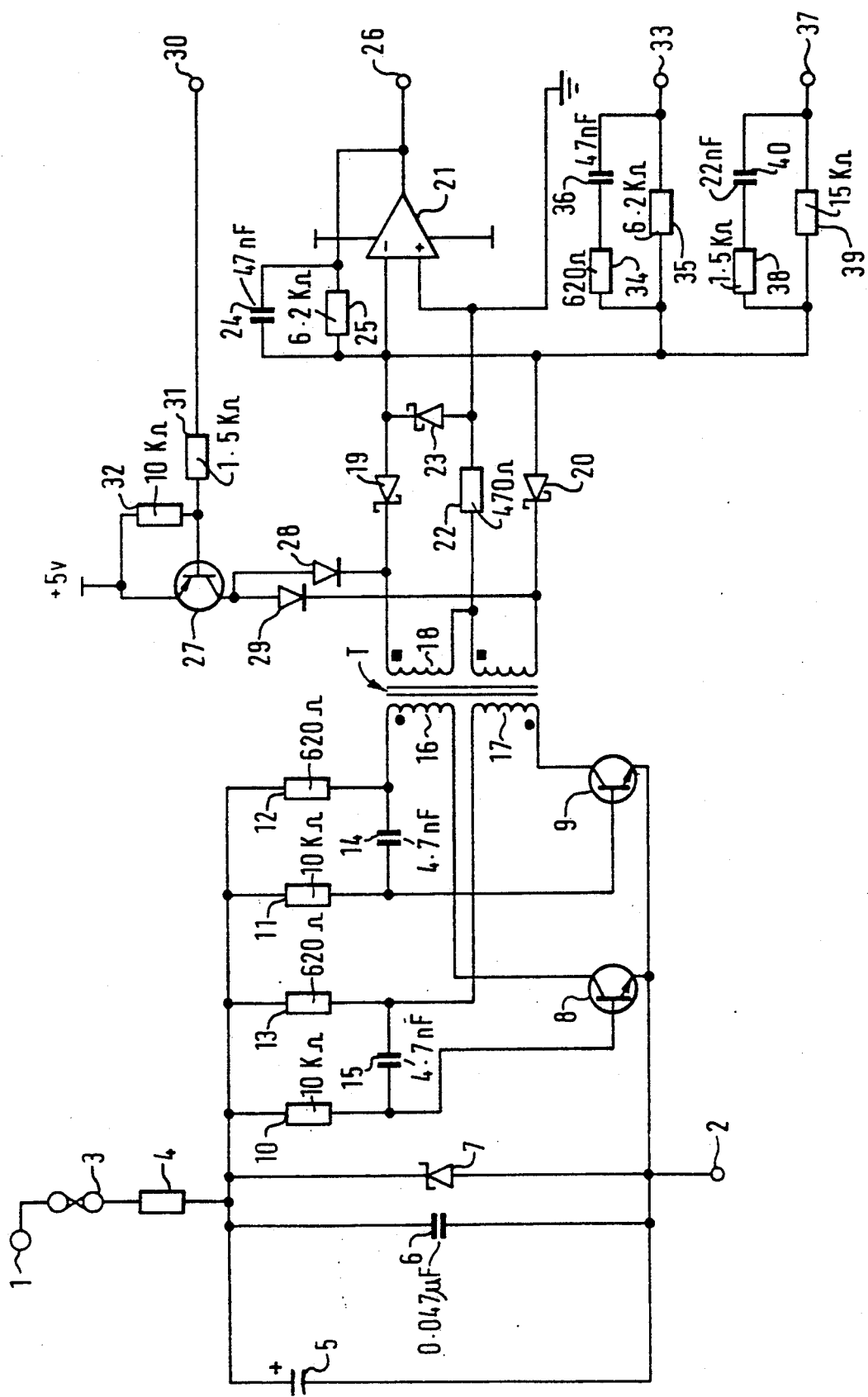

VOLTAGE DETECTION

The present invention relates to voltage detection, for example in an interlocking system for a railway system for detecting a voltage which is used for controlling a particular controlled element.

It is a common requirement to detect a voltage and produce an output dependent on the detected voltage for control purposes.

In the field of railway signalling, for example, it is essential that voltage detection circuitry be designed with safety in mind. For example, in the event of a fault in circuitry in an interlocking system which controls points and/or signal lamps, the system should not set the points and/or the lamps to a potentially dangerous condition. More particularly, in the event of a fault, a controlled signal lamp should not be set to "green" for example, so that, for safety, a train does not have authority to proceed.

In the case of a signal lamp, typically it is set to "green" by the contacts of a relay being closed. The type of signalling relay used in railway signalling is safe in itself because, if such a relay fails, it will do so by going "open circuit", with its contacts open, meaning that a failure in the relay will not cause the signal lamp to be set to "green". Where such signalling relays are replaced by solid state electronics, it must be ensured that the voltage detection circuitry in such electronics must also be fail-safe, namely if there is a fault in it or the voltage supply to it is faulty, the circuitry must produce a "low" output level, this output level being not sufficient to set a controlled element to a potentially dangerous condition.

According to the present invention, there is provided a circuit arrangement for detecting a voltage at an input and producing at an output a current dependent on the voltage, the arrangement comprising an oscillator responsive to the voltage, the oscillator including at least one transistor having a load which includes an impedance and a primary winding of a transformer, wherein the or each impedance is a low impedance proof impedance and the transformer is a current transformer, the said output current flowing through a secondary winding of the transformer and the output being isolated from the input as a result of the transformer.

A low impedance proof impedance is one which is of a type such that its impedance can only increase, or not decrease by a significant amount, if it is faulty.

The present invention will now be described, by way of example, with reference to the single FIGURE of the accompanying drawing, which is a circuit diagram of an example of a voltage detection circuit arrangement for use in an interlocking system for controlling a signal lamp and/or points of a railway system.

Referring to the drawing, an input voltage is applied across terminals 1 and 2, this voltage determining the condition to which a controlled element (such as points) in a railway system is to be set. Reference numeral 3 designates a fuse and reference numerals 4 and 5 designate a resistor and a capacitor respectively which provide an RC filter network for filtering out an alternating current component in the voltage across terminals 1 and 2. Reference numeral 6 designates a noise reducing capacitor and reference numeral 7 designates a Zener diode which acts as a voltage clamp. Connected across diode 7 is an oscillator circuit (in particular an astable multivibrator) comprising a pair of transistors 8 and 9, a pair of resistors 10 and 11 in series with the bases of transistors 8 and 9 respectively, a pair of resistors 12 and 13 in series with the collectors of transistors 8 and 9 respectively (as loads for these transistors) and a pair of capacitors 14 and 15. The oscillator frequency of the oscillator is determined by the value of resistors 10 and 11 and the value of capacitors 14 and 15. The collector of transistor 8 is connected with the resistor 12 via a primary winding 16 of a step-down current transformer T and the collector of transistor 9 is connected with the resistor 13 via the other primary winding 17 of transformer T, the transformer T acting as a current transformer because of the nature of its load, which is of low impedance.

Each of resistors 4, 12 and 13 is a low resistance proof resistor.

The opposite ends of the centre-tapped secondary winding 18 of transformer T are connected via Schottky diodes 19 and 20 respectively to the inverting input of an operational amplifier 21, the centre tap of secondary winding 18 being connected via a resistor 22 to the non-inverting input of operational amplifier 21 and to the circuit arrangement's ground terminal, a Schottky diode 23 acting as a clamping diode between the inverting and non-inverting inputs of operational amplifier 21. A feed-back network comprising a resistor 25 and a capacitor 24 in parallel with it is connected between the output and the inverting input of operational amplifier 21.

In operation, the above-described oscillator produces an oscillation of an amplitude dependent on the voltage across terminals 1 and 2, the load currents through resistor 12 (and primary winding 16) and resistor 13 (and primary winding 17) being sensed by the respective halves of the secondary winding 18 of transformer T, to produce through secondary winding 18 a current proportional to the voltage across terminals 1 and 2. In normal operation, this voltage is either a high or a low voltage, resulting in either a "high" level at the output of amplifier 21 or a "low" level at the output of amplifier 21 respectively. The output of amplifier 21 is connected via a terminal 26 to analogue to digital conversion circuitry for subsequent processing to produce the required control signal.

By virtue of the resistors 4, 12 and 13 being low resistance proof resistors and the transformer T being a current transformer, if any of them fails the arrangement is such that, regardless of the voltage across terminals 1 and 2, the current amplitude through secondary winding 18 will be such that the level at the output of the amplifier 21 is "low". Thus, by using low resistance proof resistors at least as the transistor loads and sensing the load currents with a current transformer, the current through the secondary winding 18 of the transformer T is proportional to the voltage across terminals 1 and 2 in a fail-safe manner. The transformer could be of split bobbin construction to guarantee isolation.

The RC filter comprising resistor 4 and capacitor 5 is intended to filter an alternating current component in the voltage across terminals 1 and 2 (the component values of resistor 4 and capacitor 5 being chosen for the particular application) to enable the circuit arrangement to function with an alternating current component in the voltage across terminals 1 and 2. For safety, software of the circuitry which processes the output level of amplifier 21 is adapted to detect any alternating current component which happens to exist as a result of capacitor 5 having failed, to cause the output level of amplifier 21 to be regarded as "low".

There will now be described circuitry for use in testing the gain of the operational amplifier 21. A transistor 27 has its emitter connected to a voltage supply and its collector connected via diodes 28 and 29 to the opposite ends of secondary winding 18 of transformer T. A terminal 30 is connected to the base of transistor 27 via a resistor 31, a resistor 32 being connected between the base of transistor 27 and its voltage supply. For testing periodically the gain of amplifier 21, first an appropriate voltage is applied to terminal 30 whereby transistor 27 is turned on and diodes 19 and 20 are reverse-biased via the voltage supply of transistor 27 so that the amplifier 21 is isolated from the secondary winding 18 of transformer T, resistor 22 limiting the saturation of transformer T. For testing the amplifier 21 under the condition of a "high" input, a voltage is applied to the inverting input of amplifier 21 from a terminal 33 via a network comprising resistors 34 and 35 and a capacitor 36. For testing the gain of amplifier 21 under the condition of a "low" input, the voltage is applied to the inverting input of amplifier 21 from a terminal 37 via a network comprising resistors 38 and 39 and a capacitor 40.

I claim:

1. A circuit arrangement for detecting a voltage at an input and producing at an output a current dependent on the voltage, the arrangement comprising: an oscillator responsive to the voltage, the oscillator including at least one transistor having a load which comprises an impedance and a primary winding of a transformer, wherein said impedance is a low impedance proof impedance and said transformer is a current transformer, the current flowing through a secondary winding of the transformer and the output being isolated from the input by the transformer;

an operational amplifier being connected with the secondary winding of the current transformer, the amplifier having a first, high output level if the said voltage is of a first value, and a second, low output level if the said voltage is of a second, low value; and opposite ends of said secondary winding being connected with a first input of the operational amplifier and a center tap of the secondary winding being connected with another input of the operational amplifier.

2. An arrangement according to claim 1, wherein the oscillator comprises first and second transistors connected as an astable multivibrator, the load of the first transistor comprising a first primary winding of the current transformer and a first low impedance proof impedance and the load of the second transistor comprising a second primary winding of the current transformer and a second low impedance proof impedance.

3. An arrangement according to claim 1, wherein the or each low impedance proof impedance is a low resistance proof resistor.

4. An arrangement according to claim 1, wherein a filter network including a resistor and a capacitor is provided for filtering an alternating current component in the said voltage, the said resistor of the network being a low resistance proof resistor.

5. A circuit arrangement according to claim 1, in an interlocking system for use in controlling a controlled element of a railway system.

* * * * *